United States Patent
Lechner

(10) Patent No.: US 7,629,837 B2
(45) Date of Patent: Dec. 8, 2009

(54) NOISE REDUCTION FOR SWITCHED CAPACITOR ASSEMBLIES

(75) Inventor: Moritz Lechner, Stäfa (CH)

(73) Assignee: Sensirion AG, Stafa (CH)

( * ) Notice: Subject to any disclaimer, the term of this patent is extended or adjusted under 35 U.S.C. 154(b) by 0 days.

(21) Appl. No.: 12/075,037

(22) Filed: Mar. 7, 2008

(65) Prior Publication Data
US 2008/0224762 A1  Sep. 18, 2008

(30) Foreign Application Priority Data
Mar. 15, 2007  (EP) .................. 07005335

(51) Int. Cl.
*H03K 5/00* (2006.01)
(52) U.S. Cl. .................. 327/554; 327/34; 327/551
(58) Field of Classification Search ......... 327/551–559, 327/34
See application file for complete search history.

(56) References Cited

U.S. PATENT DOCUMENTS

| | | | |
|---|---|---|---|
| 4,761,572 A | 8/1988 | Tanizawa | |
| 5,748,034 A * | 5/1998 | Ketineni et al. | ............. 327/551 |
| 5,815,030 A * | 9/1998 | Wuidart et al. | ............. 327/551 |
| 6,027,827 A | 2/2000 | Gan et al. | |
| 6,037,827 A | 3/2000 | Fisch | |
| 6,215,432 B1 | 4/2001 | Tann | |
| 6,888,358 B2 | 5/2005 | Lechner et al. | |
| 7,116,150 B2 * | 10/2006 | Francom | .................. 327/178 |

FOREIGN PATENT DOCUMENTS

| | | |
|---|---|---|
| DE | 10129300 | 2/2002 |
| EP | 237898 | 9/1987 |
| EP | 1335493 | 8/2003 |
| JP | 60208120 | 10/1985 |
| WO | WO0052829 | 9/2000 |

OTHER PUBLICATIONS

European Search Report of 07005335 dated Sep. 9, 2007.
IEEE Journal of Solid-State Circuits, vol. 29, No. 8, Aug. 1994, Special Brief Papers, Smart Sensor Interface with A/D Conversion and Programmable Calibration, P. Malcovati et al.

* cited by examiner

*Primary Examiner*—Dinh T. Le
(74) *Attorney, Agent, or Firm*—Cooper & Dunham LLP

(57) ABSTRACT

An integrated circuit comprises an assembly of switched capacitors operated under control of a system clock signal. It further comprises a signal driver for generating a binary output signal at an output pad. The system clock signal is suppressed for a certain time period after each transition of the output signal, thereby preventing voltage droop generated by the transition to introduce noise in the signals of the assembly of switched capacitors.

15 Claims, 2 Drawing Sheets

NOISE REDUCTION FOR SWITCHED CAPACITOR ASSEMBLIES

CROSS REFERENCE TO RELATED APPLICATIONS

This application claims the priority of European patent application 07005335.0, filed Mar. 15, 2007, the disclosure of which is incorporated herein by reference in its entirety.

BACKGROUND OF THE INVENTION

The invention relates to a circuit comprising an assembly of switched capacitors as well as to a method for operating such a circuit and a sensor comprising such a circuit.

Switched capacitor circuits are widely used in a multitude of applications, such as filtering, signal amplification and analog-digital-conversion. WO 01/63771, for example, describes a sensor having an assembly of switched capacitors used for amplification and A/D-conversion. Such assemblies comprise a plurality of capacitors interconnected by switches, with the switches being operated by control circuitry. The control circuitry is clocked by a system clock signal and the switches are switched synchronously to the system clock signal.

This type of circuit is often equipped with an interface for carrying data off the circuit. Such an interface typically comprises at least one signal driver for generating a binary output signal, which is applied to an output pad of the circuit, such as shown in WO 01/98736.

Whenever such circuits are used to process small voltages or are required to yield high accuracy signals, noise reduction is of importance.

BRIEF SUMMARY OF THE INVENTION

Hence, it is a general object of the invention to provide a circuit and method of the type mentioned above with low noise properties.

Now, in order to implement these and still further objects of the invention, which will become more readily apparent as the description proceeds, the method for operating a circuit, in particular an integrated circuit, comprising an assembly of switched capacitors as well as at least one output pad for carrying a binary output signal off said circuit, comprises the steps of feeding a system clock signal to said assembly of switched capacitors, temporarily suppressing said system clock signal upon a 0-1 and/or 1-0 transition of said binary output signal.

In yet another aspect, the above and still further objects are implemented by a circuit, in particular an integrated circuit, comprising an assembly of switched capacitors, a system clock generator generating a system clock signal for said assembly of switched capacitors, a signal driver generating a binary output signal applied to an output pad of said circuit, characterized in that said system clock generator comprises suppression circuitry temporarily suppressing said system clock signal upon a 0-1 and/or 1-0 transition of said binary output signal.

Accordingly, in both aspects the system clock signal used to operate the switched capacitor assembly is interrupted upon a 0-1 and/or 1-0 transition of the binary output signal generated by the signal driver.

This scheme is based on the understanding that the current drawn from the output pad during a 0-1 or 1-0 transition of the binary output signal introduces noise in the circuitry due to supply droop. By suppressing the system clock signal upon a transition of the binary output signal, signal processing can be stopped while the supply voltage of the circuit fluctuates due to the supply droop.

The invention is especially useful for integrated circuits, where supply droop effects tend to be significant.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
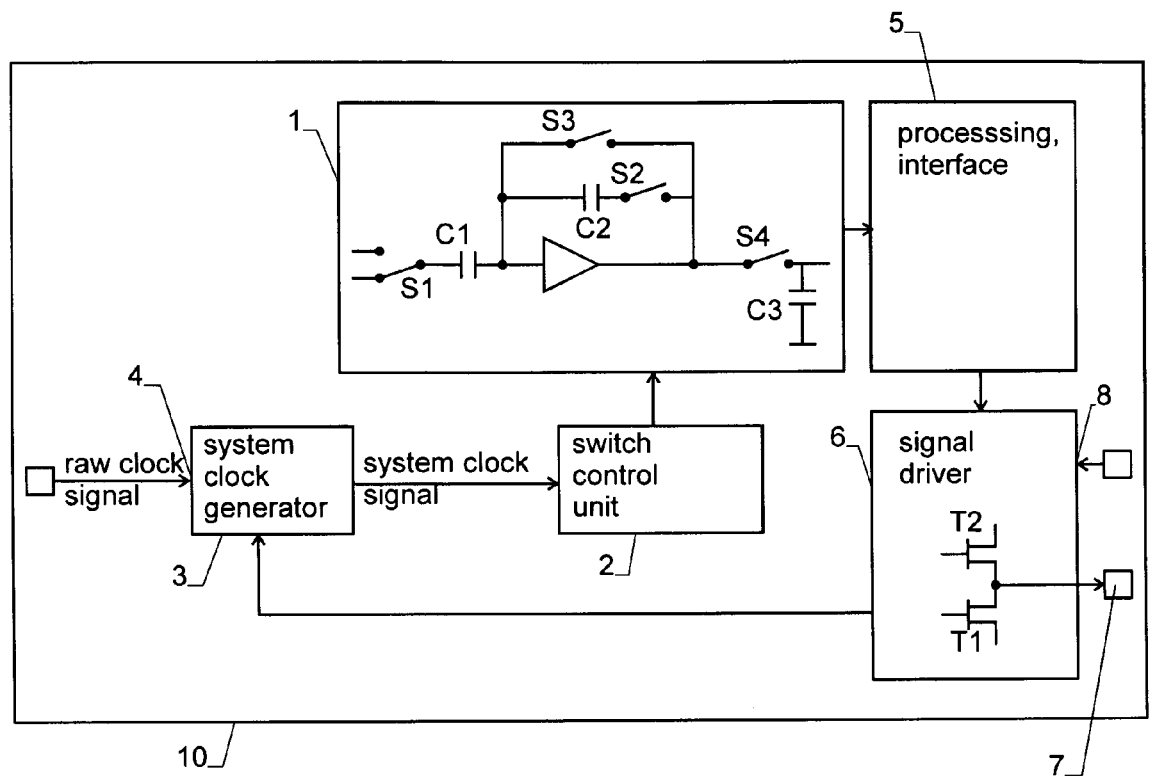
FIG. 1 is a block diagram of a circuit with switched capacitor assembly.

The circuit of FIG. 1 has an assembly 1 of switched capacitors, which is schematically illustrated to comprise a plurality of capacitors C1, C2, C3 and switches S1, S2, S3, S4. Assembly 1 can e.g. form an amplifier and sigma-delta-converter as described in WO 01/63771. Alternatively, assembly 1 can also form a filter, amplifier or any other type of circuit that can be formed using a network of switched capacitors.

A switch control unit 2 is provided for controlling the operation of the switches of assembly 1 using a timing sequence as appropriate of the functionality of assembly 1.

Switch control unit 2 is driven by a system clock signal generated by a system clock generator 3. In the pre-sent embodiment, system clock generator 3 has a raw clock input 4 for receiving a raw clock signal. The raw clock signal can either be generated externally to the circuit or it can be generated by an oscillator forming part of the circuit.

The output signals from assembly 1 are, in the present embodiment, fed to a processing and interface circuit 5, which may e.g. comprise a digital signal processor, a digital interface controller or similar circuitry. Depending on the processing complexity of the circuit, processing interface 5 may or may not be required.

A signal driver 6 is provided for generating a binary output signal at an output pad 7, from where the binary output signal can be carried off the circuit. Depending on the specifications of the circuit, the signal driver typically comprises a pull-down transistor T1 for pulling the signal at output pad 7 to ground, a pull-up transistor T2 for pulling the signal at output pad 7 to Vdd, or both as illustrated in FIG. 1.

Signal driver 6 may be equipped with a trigger input 8, where a trigger signal can be applied for triggering the read-out operation of the output signal. In other words, the transitions of the binary output signal may be asynchronous in respect to the system clock signal.

Even though the trigger input 8 is shown as an external input in FIG. 1, the trigger signal could also be generated by an on-chip source. For example, a clock signal derived from a second oscillator or from a frequency divided version of the raw clock signal can be used as trigger signal.

The binary output signal can e.g. be a serialized digital signal, or a frequency modulated trace of binary pulses, or a pulse-width modulated trace of binary pulses. The manner in which information is encoded in the binary output signal is of no significance in the present context, as long as the binary output signal is binary, i.e. its value is either at a low voltage (such as ground) or at a high voltage (such as Vdd) with fast transitions between the two voltages.

Typically, the pulse frequency of the output signal will be much smaller than the frequency of the system clock signal.

As illustrated, the binary output signal (or a signal equivalent thereto) is fed back from signal driver 6 to system clock generator 3, for reasons which will be described in the following.

The various components of the circuit of FIG. 1 are advantageously integrated on a single semiconductor chip 10. Pad 7, as well as the other pads illustrated in FIG. 1, are bonding pads of the semiconductor chip 10. The present invention is of particular advantage if at least assembly 1 and signal driver 6 are commonly integrated on the same semiconductor chip 10.

Figure 2:
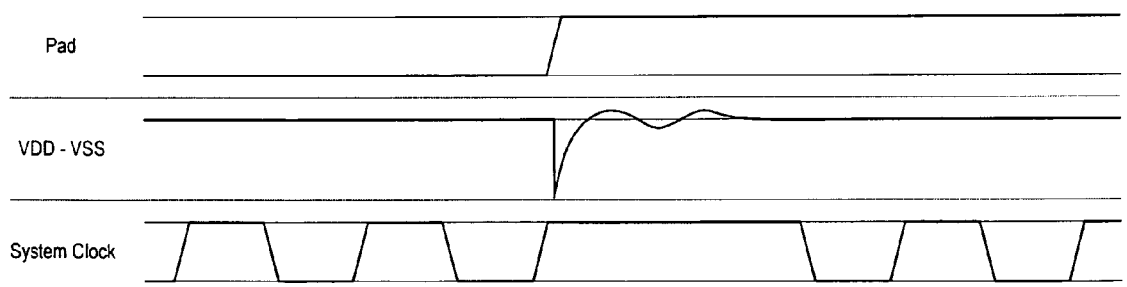
FIG. 2 illustrates the suppression of the system clock signal upon a 0-1 transition of the binary output signal.

The operation of the circuit is now described with reference to the timing diagrams of FIG. 2, which illustrate the voltages at the binary output signal, the supply voltage (Vdd-Vss) as well as the system clock signal during a 0-1-transition of the binary output signal.

As can be seen, the 0-1-transition induces noise in the supply voltage. This effect, which is known to the person skilled in the art under the term "supply droop", is primarily caused by transistor T2 drawing current in order to pull output pad 7 (and the load connected thereto) to a high voltage potential.

The supply droop generates noise in the circuit, which is likely to affect the accuracy of operation of assembly 1. In order to avoid this, the system clock signal is frozen for a certain time period after a transition of the binary output signal. The length of this time period depends on the time the supply voltage normally needs to stabilize. Typically, this time is between 0.5 µs and 10 µs.

Since, in a switched capacitor system, an analog signal is sampled at each rising and/or falling clock edge, suppressing the system clock signal while the supply voltage is unstable allows to increase the accuracy of the analog processing.

Figure 3:
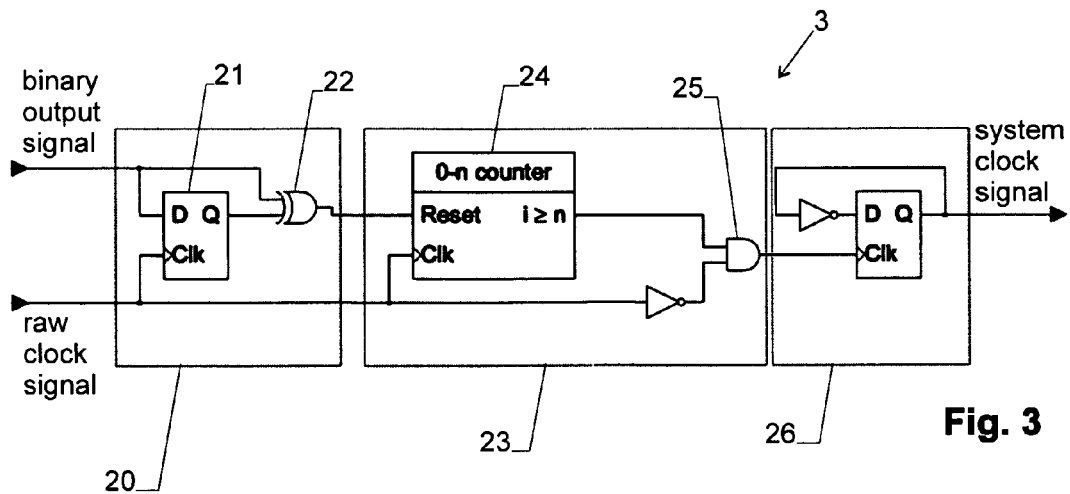
FIG. 3 shows a possible implementation of the system clock generator.

FIG. 3 shows an example for an implementation of system clock generator 3.

A transition detector 20 is used to detect a 0-1 or 1-0 transition of the binary output signal. It comprises a register 21 and an XOR gate 22 connected to generate a pulse at the output of XOR gate 22 when the binary output signal changes state.

This output pulse is fed to suppression circuitry 23 comprising a 0-to-n counter 24. 0-to-n counter 24 is reset by the output pulse from XOR gate 22 and then starts to count the pulses of the raw clock signal. Counter 24 generates a suppression interval signal, labeled i≧n in FIG. 3, which is zero when less than n pulses of the raw clock signal have passed since the last transition of the binary output signal. The suppression interval signal is ANDed to the inverted raw clock signal in an AND gate 25 for generating a modified raw clock signal. In normal operation, the modified raw clock signal is an inverted version of the raw clock signal, but it is 0 for n raw clock signal periods after a transition of the binary output signal.

The modified raw clock signal is fed to a frequency divider 26 dividing the frequency by a factor of at least 2 for generating the system clock signal.

Figure 4:
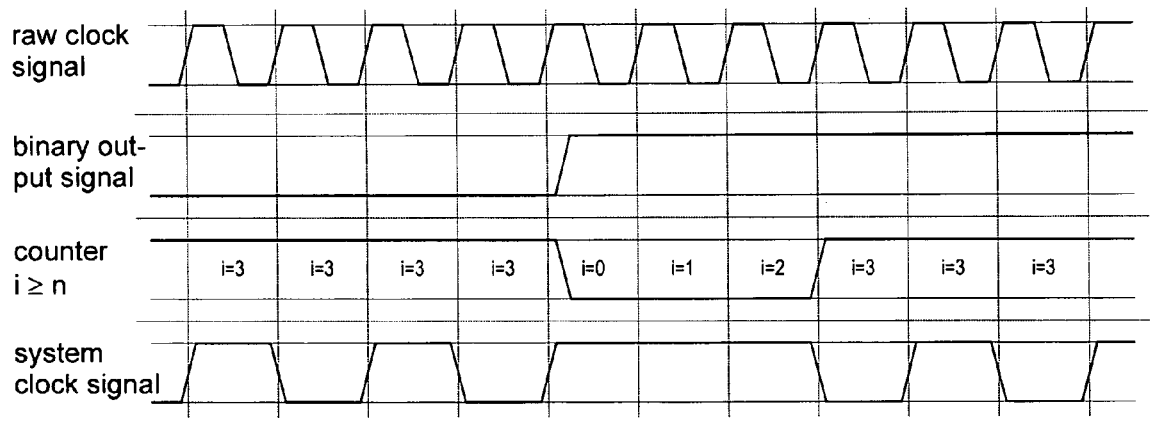
FIG. 4 shows the signals in the system clock generator of FIG. 3.

The various pulse trains for a 0-1 transition of the binary output signal and for n=3 are shown in FIG. 4.

The present invention is particularly suited for sensor devices, such as flow sensors, pressure sensors or substance sensors, where a low noise level is of importance.

It must be noted that the system clock generator 3 of FIG. 3 is only one of various possible embodiments fulfilling the same functionality. For example, instead of feeding the binary output signal to the transition detector 20, the signal from trigger input 8 can be used for triggering a suppression of the system clock signal if signal driver 6 is designed in such a manner that any transition of the binary output signal is preceded by a transition at trigger input 8.

Also, system clock generator 3 can be modified to suppress the system clock signal only upon a 0-1 transition or only upon a 1-0 transition, but not both, if only one of them generates a significant voltage droop.

While there are shown and described presently preferred embodiments of the invention, it is to be distinctly understood that the invention is not limited thereto but may be otherwise variously embodied and practiced within the scope of the following claims.

The invention claimed is:

1. A method for operating a circuit, in particular an integrated circuit, comprising an assembly of switched capacitors as well as at least one output pad for outputting a binary output signal off said circuit, said method comprising,
   feeding a system clock signal by means of a clock generator having suppression circuitry to said assembly of switched capacitors,
   temporarily suppressing said system clock signal using said suppression circuitry upon a 0-1 and/or 1-0 transition of said binary output signal.

2. The method of claim 1 wherein, upon said 0-1 and/or 1-0 transition, said system clock signal is interrupted for at least 0.5 µs.

3. The method of claim 1 wherein, upon said 0-1 and/or 1-0 transition, said system clock signal is interrupted for no more than 10 µs.

4. The method of claim 1 wherein said 0-1 and/or 1-0 transition is/are asynchronous in respect to said system clock signal.

5. A circuit comprising:
   an assembly of switched capacitors,
   a system clock generator generating a system clock signal for said assembly of switched capacitors,
   a signal driver generating a binary output signal applied to an output pad of said circuit,
   wherein said system clock generator comprises suppression circuitry temporarily suppressing said system clock signal upon a 0-1 and/or 1-0 transition of said binary output signal.

6. The circuit of claim 5 wherein said system clock generator comprises a raw clock input for receiving a raw clock signal, wherein said system clock signal is derived from said raw clock signal unless said suppression circuitry temporarily suppresses said system clock signal.

7. The circuit of claim 6 wherein said suppression circuitry comprises a counter clocked by said raw clock signal to generate a suppression interval signal upon said 0-1 and/or 1-0 transition.

8. The circuit of claim 6 comprising a frequency divider dividing said raw clock signal at least by a factor of two for generating said system clock signal.

9. The circuit of claim 5 wherein said signal driver comprises at least one pull-up or pull-down transistor for generating the 0-1 or 1-0 transition, respectively, of said binary output signal.

10. The circuit of claim 5 wherein said assembly of switched capacitors forms at least part of an amplifier, filter and/or analog-digital converter.

11. The circuit of claim 5 wherein said assembly of switched capacitors and said signal driver are integrated on at least one semiconductor chip.

12. The circuit of claim 5 wherein said assembly of switched capacitors and said signal driver are integrated on a common semiconductor chip.

13. A sensor device comprising the circuit of claim 5.

14. A method for operating an integrated circuit comprising circuitry and at least one output for outputting a binary signal, said method comprising:
 providing a system clock signal by means of a clock generator having suppression circuitry to said circuitry; and
 temporarily suppressing said system clock signal using said suppression circuitry upon a 0-1 and/or 1-0 transition of said output binary signal.

15. An integrated circuit comprising:
 an assembly of circuitry;
 a system clock generator generating a system clock signal for said assembly of circuitry;
 a signal driver generating a binary output signal applied to an output of said integrated circuit; and
 wherein said system clock generator comprises suppression circuitry temporarily suppressing said system clock signal upon a 0-1 and/or 1-0 transition of said binary output signal.

* * * * *